United States Patent [19]

Paschal et al.

[11] 4,093,878

[45] June 6, 1978

[54] DE-GLITCHABLE NON-METASTABLE FLIP-FLOP CIRCUIT

[75] Inventors: James P. Paschal; Donald F. Nickel; Charles J. Drozd, all of West Columbia, S.C.

[73] Assignee: NCR Corporation, Dayton, Ohio

[21] Appl. No.: 745,740

[22] Filed: Nov. 29, 1976

[51] Int. Cl.² ........................................... H03K 3/286
[52] U.S. Cl. .................................. 307/291; 307/215; 307/247 R; 328/195; 328/196; 328/206
[58] Field of Search .......... 307/215, 228, 232, 247 R, 307/289, 291; 328/109, 127, 196, 206, 195

[56] References Cited

U.S. PATENT DOCUMENTS

| | | | |
|---|---|---|---|
| 3,953,744 | 4/1976 | Kawagoe | 307/215 X |
| 3,983,496 | 9/1976 | Bedford et al. | 307/362 X |

*Primary Examiner*—John Zazworsky
*Attorney, Agent, or Firm*—J. T. Cavender; Edward Dugas; Stephen F. Jewett

[57] ABSTRACT

The flip-flop circuit of the present invention is one that cannot glitch or enter a metastable hang-up state and has a probability of one of being completely settled at some given finite time following clocking. The flip-flop circuit is comprised of an input logic gate, an integrator and a logic latch circuit. In operation, the input logic gate changes state upon the coincidence of input signals, which change in state causes the integrator to change output level at a controlled rate. The latch circuit is sensitive to the output level of the integrator and changes state only when the integrator's output level reaches or exceeds preselected thresholds.

10 Claims, 8 Drawing Figures

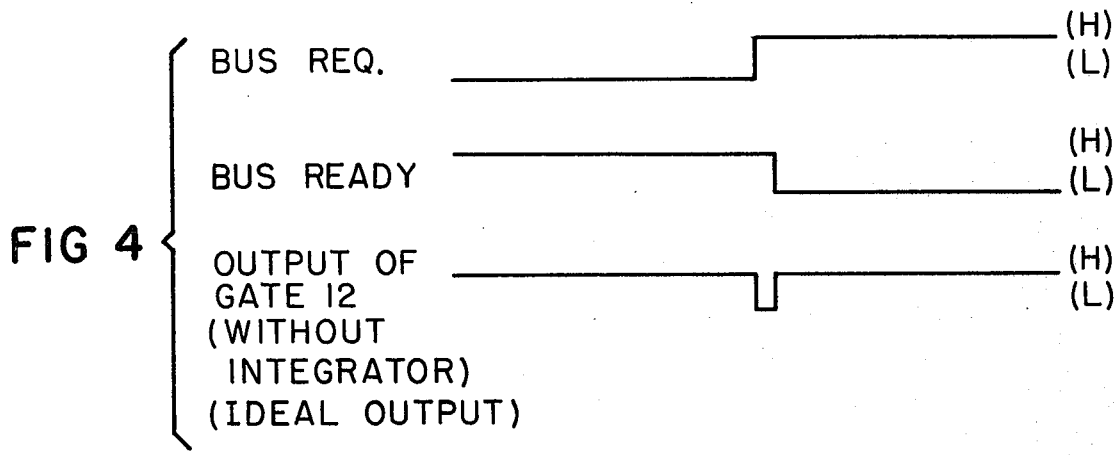
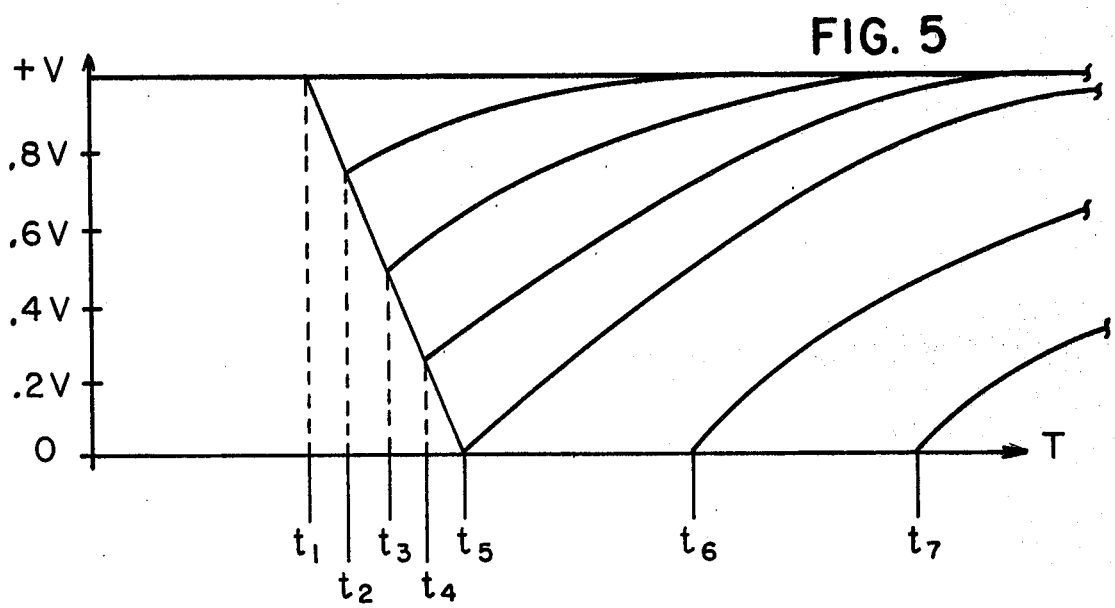
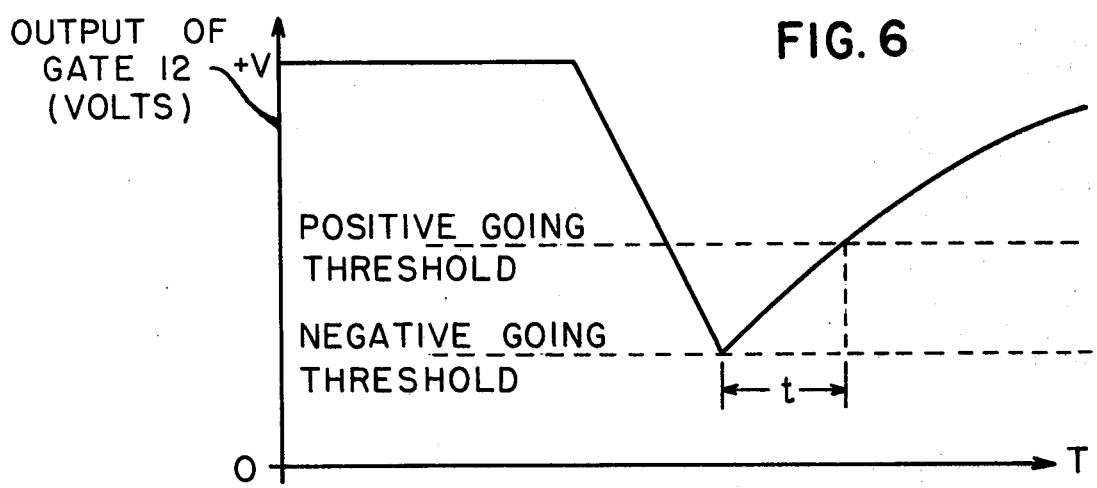

DE-GLITCHABLE NON-METASTABLE FLIP-FLOP CIRCUIT

BACKGROUND OF THE INVENTION

The present invention is directed to a flip-flop circuit that cannot glitch or enter a metastable hang-up state due to asynchronous inputs. Digital logic circuits of the type used in computer systems have been faced with the problem that asynchronous signal inputs are sometimes necessary and unavoidable. A fault can occur when these asynchronous signal inputs (or a logical combination of these inputs) are used to stimulate a conventional memory element such as a latch or a flip-flop. Asynchronous signals into these types of devices have a finite probability of placing the device into a metastable state for an undefined period of time. This basic difficulty comes from the fact that any circuit or known circuit component that has memory in it, such as a flip-flop, may not settle into one of the two stable states (0 and 1) for an indefinite period following the operation under conflict. A conflict is defined as the situation that exists when one signal tries to set a flip-flop in one direction and, at the same time, another signal tries to set the flip-flop in the other direction. A flip-flop, considered as an ideal device, is always in either state 0 or state 1 at any given time, but a physically implemented flip-flop may, when operated in conflict, get into a metastable state which is neither 0 nor 1 and the flip-flop may remain in this state for an indefinite length of time. The length of time for which a metastable state lasts is random and is best characterized by probability. The probability that a conventional memory element will enter a metastable state is directly dependent on the likelihood of simultaneous activation of two or more signal inputs. Also the affect of a metastable state may vary from a "don't care" condition in some circuits to a complete system failure in others. An arbitration circuit to determine priorities for a shared computer bus is particularly sensitive to the metastable problem due to the chance and frequency of simultaneous inputs being relatively high and the consequence of a metastable condition being usually severe. A number of prior art devices have attempted to minimize and/or eliminate this particular problem. One particular prior art device is disclosed in U.S. Pat. No. 3,219,845, entitled "Bistable Electrical Circuit Utilizing NOR Circuits Without AC Coupling", by N. Y. Nieh. The circuit of the referenced patent is comprised of four logic gates which are connected to operate as a JK flip-flop having a reset and a set input. Feedback is provided from two of the logic elements back to the inputs of the preceding logic elements. Inserted in each of the feedback paths is a delay means comprised of shunt capacitance. The delay means produces a delay in transferring pulses between the stages of the circuit. This delay prevents a signal race condition from existing.

Another circuit of interest is described in U.S. Pat. No. 3,824,409, entitled "Arbiter Circuits", S. S. Patil. The circuit of the referenced patent uses a first arbiter circuit having a narrow acceptance window through which signals may pass as long as the difference between the arrival of the signals is within the time slot of the window. If two or more signals arrive at times that are greater than the time slot of the window, the first signal to arrive is received and transmitted while all others are stopped. In order to then determine which of the two signals that has passed through the first arbiter circuit is in reality first in time, a delay element is inserted into the signal path of one of the passed signals. This, in turn, increases the time separation between the two signals which are again passed through an arbiter circuit, which circuit has its window fixed in duration so as to stop the second signal. The signals passing through the arbiter circuit can then be applied to latching circuits or flip-flop circuits with a minimum probability of conflict.

The circuit of the present invention is designed to completely eliminate the probability of a glitch or a metastable state with a minimum use of elements.

SUMMARY OF THE INVENTION

The present invention in its most basic form is comprised of an input gate for providing a change in state upon the occurrence of an overlapping condition between two or more input signals. An integrator circuit is connected to integrate the output of the input gate. A latch circuit having a threshold sensing input changes state when the integrated signal reaches or exceeds the threshold of its input in conjunction with the occurrence of one or more of the input signals.

More specifically, in one preferred embodiment of the present invention, there is provided a circuit having a multiple input NAND gate with an open collector output. One input of the NAND gate is adapted to receive a BUS REQ. signal while the other input is adapted to receive a BUS READY signal. The circuit is also comprised of a standard two-input NAND gate and a two-input NAND gate having Schmitt trigger inputs. The standard two-input NAND gate has one of its inputs connected to receive the BUS REQ. signal and its other input connected to the output of the Schmitt trigger NAND gate. The output of the standard NAND gate is the circuit output and it is also connected back to one input of the Schmitt trigger NAND gate. At the output of the open collector NAND gate there is provided an integrator circuit comprised of a potential source, a resistor and a capacitor, which capacitor is connected to a reference potential such as ground. The junction point of the resistor and capacitor is connected to the output of the open collector NAND gate and to the other input of the Schmitt trigger NAND gate. With overlapping logic "1" inputs on the inputs of the open collector NAND gate, the output of the NAND gate moves to a logic level 0 or to a potential corresponding to the reference potential. This, in turn, forces the charge that has been stored on the capacitor to be depleted at a finite rate. The triggering level set at the input of the Schmitt NAND gate is fixed at a level which insures that a real signal is being received by the open collector NAND gate. When the charge on the capacitor has decreased in magnitude to a level that activates the Schmitt trigger, the circuit will recognize this as being a true logic 0 input. When either input of the open collector NAND gate goes to a logic level 0, the open collector NAND gate output tends to move to a level 1. The capacitor will commence charging to a level near the potential source. As this level increases past the positive threshold of the Schmitt trigger input, the circuit will recognize this passage as a true logic 1 input.

From the foregoing it can be seen that it is a primary object of the present invention to provide an improved flip-flop circuit for differentiating conflicting inputs.

It is another object of the present invention to provide a circuit which is immune from falling into the metastable state.

These and other objects of the present invention will become more apparent when taken in conjunction with the following description and attached drawings, which drawings form a part of the present invention, and wherein like characters indicate like parts.

BRIEF DESCRIPTION OF THE DRAWINGS

FIG. 4 is a third group of waveforms illustrating a third operating condition for the circuit of FIG. 1;

FIG. 5 illustrates signals of multiple levels for the output of one of the elements of the circuit of FIG. 1;

FIG. 6 is a waveform diagram illustrating one operating condition for the circuit of FIG. 1;

DESCRIPTION OF THE PREFERRED EMBODIMENTS OF THE INVENTION

Figure 1:
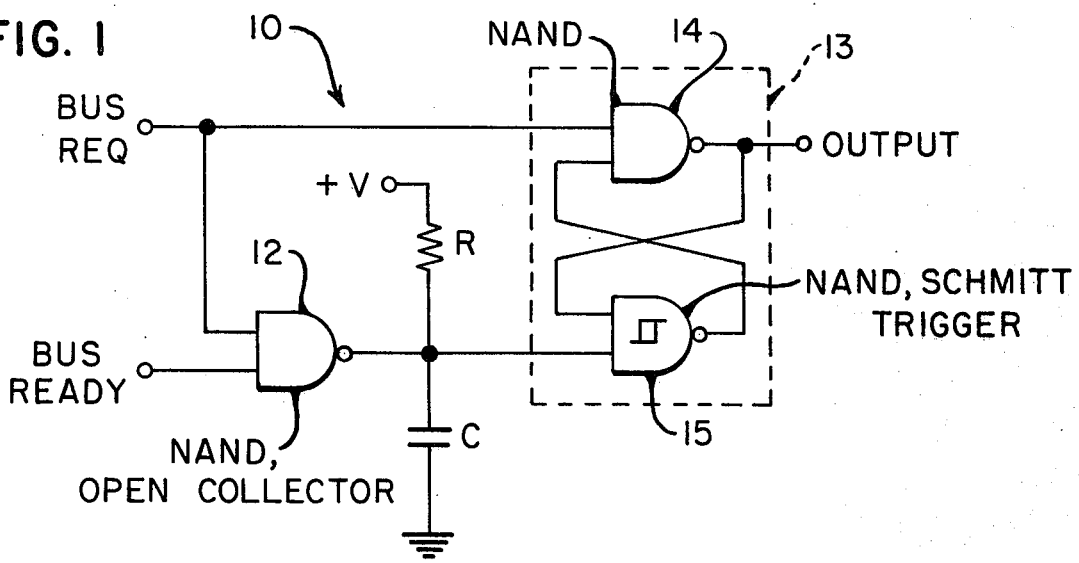
FIG. 1 is a logic schematic diagram of one preferred embodiment of the invention.

Referring to FIG. 1 wherein is disclosed one preferred flip-flop of the present invention. The flip-flop 10 is comprised of an input gate 12, which may be an open collector NAND gate having two inputs, one of which is connected to a terminal adapted to receive a BUS READY signal and the other being connected to a terminal adapted to receive a BUS REQ. signal. In the preferred embodiment of the invention the BUS REQ. and BUS READY signals are used only for purposes of providing an operating environment for the circuit. It is to be understood that any two signals having asynchronous characteristics may be used effectively with the present circuit. A latch circuit 13 is shown comprised of NAND gates 14 and 15, each of which have their outputs cross-coupled back to each others inputs in the standard configuration for forming a latch circuit. The output signal from NAND gate 12 is directed to the non-coupled input of the NAND gate 15. An integrator circuit comprised of a series connected resistance R and a capacitor C, is connected at one end to a potential source +V and at the other end to a common reference point. The juncture of the resistor R and the capacitor C is connected to the output of the NAND gate 12. The other input of the NAND gate 14 is connected to receive the BUS REQ. signal. The circuit output is taken from the output of the NAND gate 14.

Figure 2:
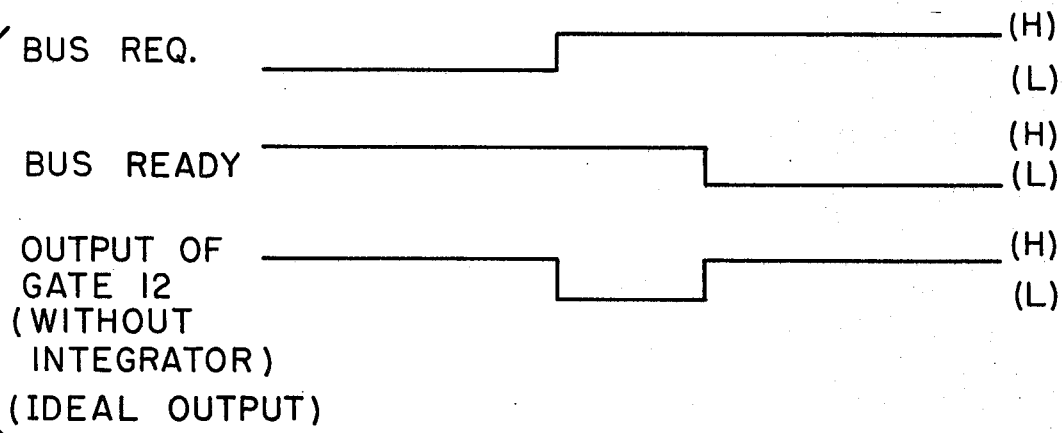
FIG. 2 illustrates a group of waveforms showing one operating condition for the circuit embodiment of FIG. 1.

Referring now to FIG. 2 in conjunction with the circuit of FIG. 1, and assuming for the purposes of this discussion that the integrating circuit is not present at the output of the NAND gate 12, we may see that the output of gate 12 will remain at a high state until the inputs, BUS REQ. and BUS READY, to the NAND gate 12 overlap in a high state condition. When this occurs, the output of gate 12 goes low and remains low for so long as both of its inputs are at a high state. For the waveform conditions shown in FIG. 2, the latch comprised of NAND gates 14 and 15 will latch due to the fact that the signal from the output of gate 12 is of a sufficient duration to enable the semiconductor logic to change states before receiving a confusing input into either gates 14 or 15.

Figure 3:
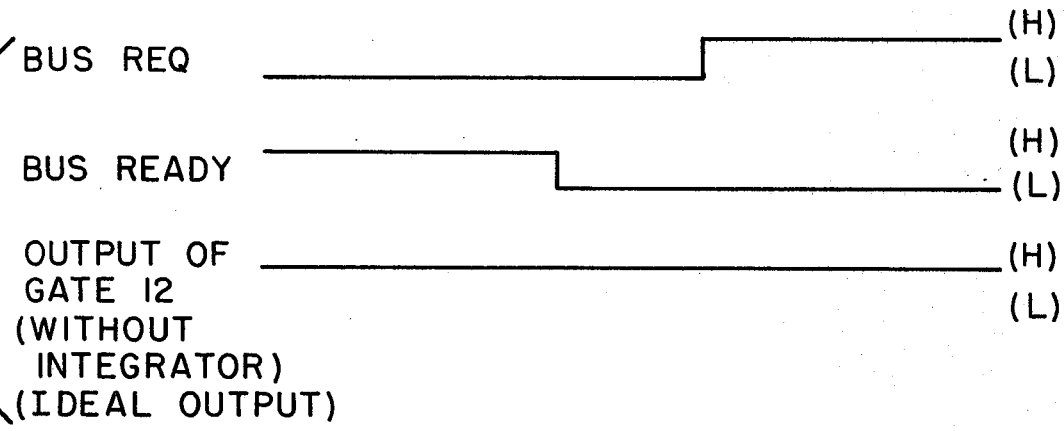
FIG. 3 illustrates a second grouping of waveforms illustrating a second operating condition for the circuit of FIG. 1.

Referring to FIG. 3 in conjunction with the circuit of FIG. 1, we see that for the waveforms of BUS REQ. and BUS READY, there is no overlapping of the waveforms at the high signal level, therefore the output of gate 12 will remain high with no transition. In turn, the latch will not be set. The two clear-cut conditions of setting and not setting of the latch have been shown with respect to the waveforms of FIGS. 2 and 3.

Now, in referring to the waveforms of FIG. 4 in conjunction with the circuit of FIG. 1, we reach the condition where a marginal overlapping occurs. In referring to FIG. 4 the BUS REQ. signal reaches a high state for a period which is relatively short prior to the BUS READY signal moving from a high state to a low state. This results in the output of gate 12 providing a pulse signal having a relatively narrow width. The width of this pulse signal may or may not be wide enough to set the latch circuit. In any event, it may cause the latch circuit to move into a metastable state, which state is for purposes of the circuit operation undesirable.

Referring back to FIG. 1, with the integrator circuit now in place at the output of the NAND gate, we can now look at FIG. 5 which shows composite views of the effect of various durations of overlap of logic level 1's at the inputs of gate 12. The varying pulse widths present at the output of gate 12 will cause the level of the signal, at the output of 12, to vary in amplitude between +V, which corresponds to the high level (H), and 0, which corresponds to the low level (L). At the indicated time $t_1$, the output of gate 12 commences towards the low level 0. It does not instantaneously reach this level due to the stored charge contained within the capacitor C. If the width of the negative-going pulse at the output of gate 12 is not of a sufficient duration, the output level of gate 12 will not reach the 0 level. This can be seen for the interim conditions corresponding to points $t_2$, $t_3$ and $t_4$, each of which, with reference to point $t_1$, correspond to differing but increasing widths of the negative-going pulse. When the pulse from gate 12 is of a magnitude between $t_1$ and $t_5$ or $t_1$ and $t_6$ or $t_1$ and $t_7$, the output of gate 12 will reach the 0 level due to the complete discharge of the voltage stored on capacitor C.

Referring now to the waveform of FIG. 6, the negative-going and the positive-going thresholds of the Schmitt trigger NAND gate 15 are shown as horizontal dotted lines in the figure. For the latch, comprised of NAND gates 14 and 15, to latch, the output of gate 12 first must decrease in value so as to reach the negative-going threshold level of the NAND gate 15. If the pulse into the Schmitt trigger input of NAND gate 15 is to be defined and recognized as a true logic 0 input, it must fall at least to the negative-going threshold. If the input falls to, or below, the negative-going threshold, it will not be recognized as a true logic 1 input until it has risen above the positive-going threshold. The minimum possible time for the logic 0 to logic 1 transition to occur is a function of the fastest maximum rise time for the signal and the minimum hysteresis window for the Schmitt input. This minimum allowable logic 0 time can be adjusted by proper sizing of the R and C combination, such that the combination of the hysteresis window and rise time exceeds the latch propagation time. With such a condition the circuit will operate in the following manner. If the inputs to the circuit 10, namely the BUS REQ. and the BUS READY signals, overlap in the high state, the output of gate 12 turns on and pulls the latch input at the input to gate 15 towards ground. If the states of the input signals to the gate 12 change such that the signals no longer overlap in the high state, the output of gate 12 begins to turn off and the resistor R begins to charge the capacitor C towards the supply voltage V.

Figure 7:
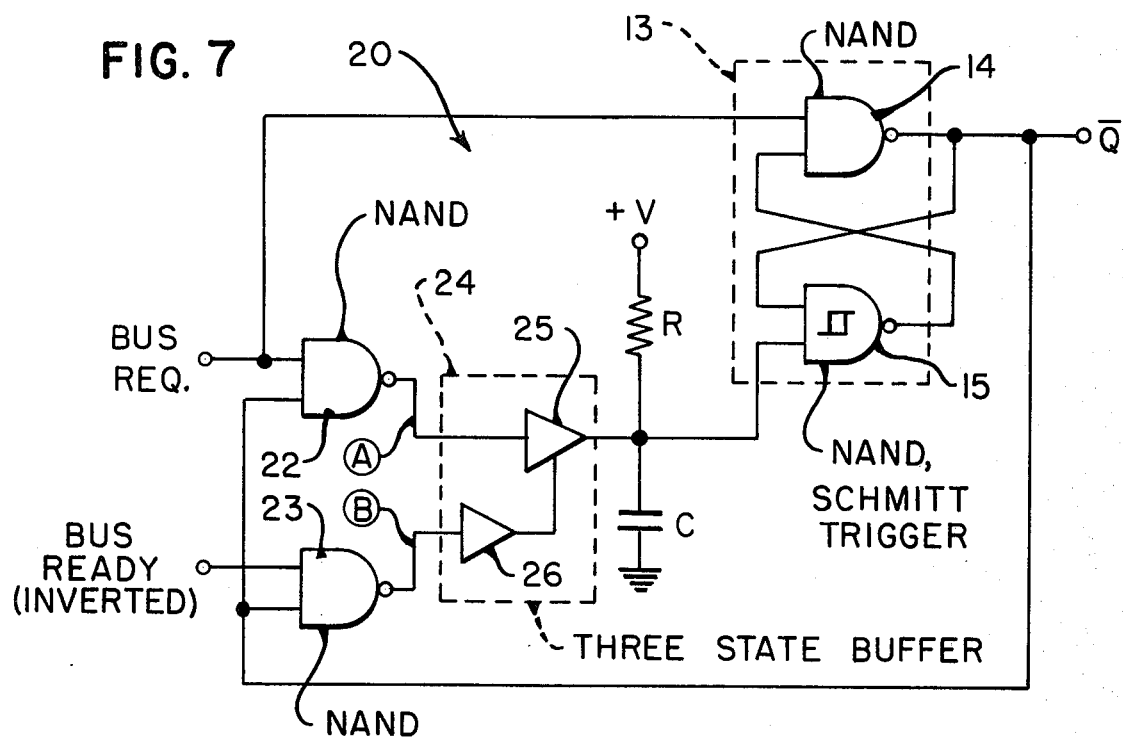
FIG. 7 illustrates in logic diagram form a second preferred embodiment of the invention.

Referring to FIG. 7, a second embodiment of a flip-flop 20 is shown comprised of a NAND gate 22. One input of the NAND gate is connected to receive the BUS REQ. signal and is also connected to one input of the latch circuit, specifically an input to the NAND gate 14. The other input of NAND gate 22 is connected to the input of NAND gate 23 and to the output of the latch circuit, taken from the output of NAND gate 14, which output is designated Q. The other input to NAND gate 23 is the BUS READY (inverted) signal, with the output of NAND gate 22 and NAND gate 23 being directed to a three-state buffer unit 24 comprised of a non-inverting amplifier 26 for enabling and disabling the gate of a three-state logic device. A three-state logic device is one having an extra input called an ENABLE/DISABLE gating input. When the device is enabled, the output of the device can either be at a "logic 0" or a "logic 1" state, but not both. When the device is disabled, then the output is disconnected from the remainder of the circuit. The output of the three-state unit 24 is directed to the junction of the integrating circuit comprised of resistors R and C. The juncture of the R and C components is electrically connected to the input of the Schmitt trigger NAND gate 15. The NAND gates 14 and 15 are connected in the common cross-coupled latching configuration.

The purpose of utilizing the three-state device is to overcome the disadvantage which occurred if the overlapped time was sufficient to pull the Schmitt input near gound. When this occurred, the latch circuit could not be reset until the resistor had charged the capacitor above the positive threshold level following the non-overlapped condition. This charge rate is dependent on the hysteresis window of the Schmitt trigger NAND gate and the latch propagation time. The rise time may necessarily be very slow and delay the latch reset. The three-state device has a logic 0, logic 1, and a high impedance state. If the active logic 0 and the high impedance states are used, the three-state device approximately meets the action of the open collector gate. The advantage is that in the event that the latch is set, then the other state, active logic 1, can be used to quickly charge the latch input back past the positive threshold. This will then allow the latch to be reset substantially earlier than previously possible with the open-collector approach.

Figure 8:
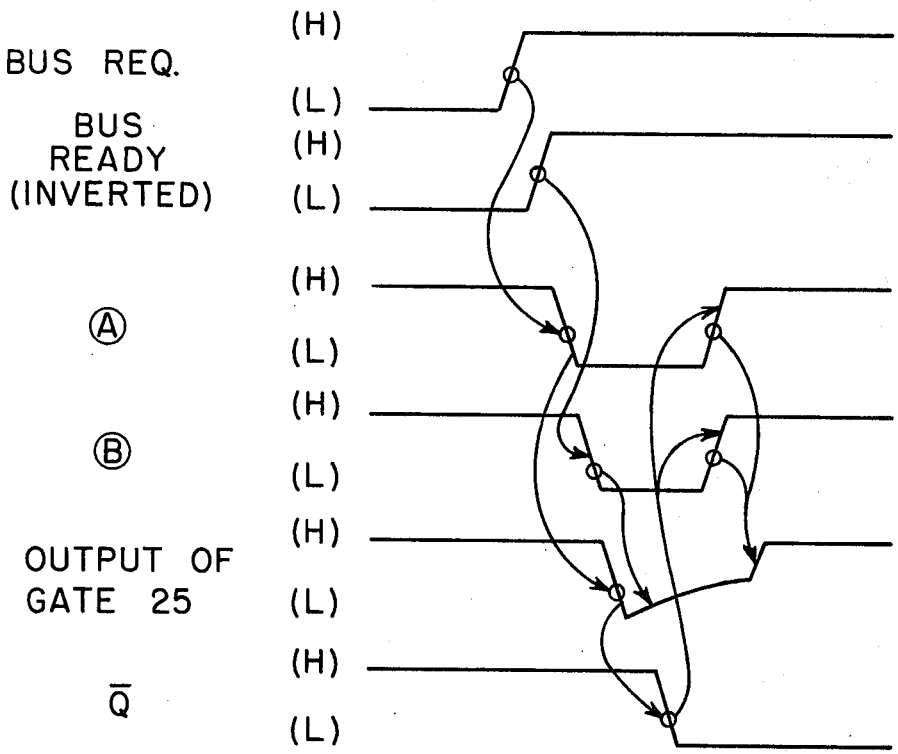
FIG. 8 illustrates a group of logic waveforms useful in understanding the operation of the second embodiment shown in FIG. 7.

FIG. 8 sets forth the waveforms located at strategic points in the embodiment shown in FIG. 7. The input to the NAND gate 23 is now the BUS READY signal inverted, wherein the prior embodiment this signal was not inverted.

In operation, referring to the waveforms of FIG. 8 in conjunction with the logic diagram of FIG. 7, we note that upon the transition of the BUS REQ. signal from a low state to a high state, the output of the NAND gate 22 within its normal propogation time, changes from the high state to the low state. During this time period the BUS READY (inverted) signal is of the low state causing the output of the NAND gate 23 to be of a high level. The transition of the state output of NAND gate 22 from the high to the low level causes the signal at the latch input, that is the signal at the input of the NAND gate 15, within standard propagation time, to transcend from the high state to the low state. This, in turn, within the proper latching time, will cause the $\bar{Q}$ output of the circuit to move from the high state to the low state. With the termination of the BUS READY (inverted) signal, the signal changes state from the low state to the high state which, in turn, changes the state of the signal present at the output of NAND gate 23 from the high state to the low state. When this occurs, amplifier 26 deactivates the three-state device 25 placing it into the high impedance condition which allows the +V source to charge the capacitor C through the resistor R. This is shown as a rising ramp signal at the latch input of NAND gate 15. When the output $\bar{Q}$ signal makes its transition from the high to the low level, this transition is fed back to the inputs of NAND gates 22 and 23 and causes the output of both of these gates to go from the low level to the high level. This puts the three-state device into its active logic 1 state and aids in pulling up the latch input to its high state.

| PARTS LIST | | |
|---|---|---|
| Circuit of Fig. 1 | 12 | Open collector NAND gate (¼ of 74538) |
| | 15 | Schmitt trigger NAND gate (¼ of 745132) |
| | 14 | Standard NAND gate (¼ of 74500) |
| | R | Resistor (1.2K ohm) |
| | C | Capacitor (470 pf) |
| Circuit of Fig. 7 | 24 | Three state buffer with non-inverting enable input (¼ of 74125) |
| | 22,23, 14 | Standard NAND gates (¼ of 74500) |
| | 15 | Schmitt trigger input NAND gate (¼ of 745132) |
| | R | Resistor (1.2K ohm) |
| | C | Capacitor (470 pf) |

While there has been shown what is considered to be preferred embodiments of the present invention, it will be manifest that many changes and modifications may be made therein without departing from the essential spirit of the invention. It is intended, therefore, in the annexed claims, to cover all such changes and modifications as may fall within the true scope of the invention.

What is claimed is:

1. An de-glitchable non-metastable flip-flop circuit comprising:
    a first gate having a first and a second input for receiving asynchronous input signals and for providing an output signal, the duration of said output signal being indicative of the degree of coincidence of said asynchronous input signals;
    first means for providing a signal the level of which is a function of the duration of said output signal; and
    second means, including threshold means activated upon sensing a particular level of signal from said first means, for receiving one of said asynchronous input signals and including means for providing a circuit output when activation of said threshold means coincides with the receipt of said one asynchronous input signal.

2. The circuit according to claim 1 wherein said first means is an integrator for integrating the output signal from said first gate.

3. The circuit according to claim 1 wherein said second means is comprised of:
- a first NAND gate having at least two inputs and one output, one of said inputs adapted to receive one of said asynchronous input signals;
- a second NAND gate having at least two inputs, one output, and a threshold level detection capability, one of said inputs being adapted to receive the provided signal from said first means, the outputs of said first and second NAND gates cross-coupled to each others inputs with the circuit output being taken from the output of said first NAND gate.

4. A de-glitchable non-metastable flip-flop circuit comprising:
- a first and second input for receiving asynchronous signals;
- a gate operatively connected to said first and second inputs for providing at its output a change of state signal upon the occurrence of an overlapping condition between signals received at said first and said second input;
- integration means connected to the output of said gate for integrating said provided change of state signal; and
- a latch means having at least one input adapted to receive said first asynchronous signal and at least a second input adapted to receive the integrated output signal from said integration means, said latch means providing an output of one state when the level of the received integration signal exceeds a given threshold in conjunction with the receipt of said first asynchronous signal, and to provide an output of another state for all other conditions.

5. The circuit according to claim 4 wherein said latch means is comprised of:
- a first NAND gate having at least two inputs and one output, one of said inputs adapted to receive said first asynchronous signal;
- a second NAND gate, having at least two inputs, one output, and a threshold level detection capability, one of said inputs being adapted to receive said integrated output signal, the outputs of said first and second NAND gates cross-coupled to each others inputs and the circuit output being taken from the output of said first NAND gate.

6. An electrical circuit comprising:
- a pair of NAND gates, each having at least two inputs and one output, one input from each of said gates adapted to receive differing input signals;
- a buffer means operatively connected to the outputs of said pair of NAND gates for providing an output signal the duration of which is indicative of the amount of overlap between said differing input signals;
- first means for providing a signal the level of which is a function of the duration of the output signal from said buffer means; and
- second means including threshold means activated upon sensing a particular level of signal from said first means and for receiving one of said differing input signals, so as to provide a circuit output when activation of said threshold means coincides with the receipt of a differing input signal, said circuit output also being fed back to the other input of each of said pair of NAND gates.

7. The electrical circuit according to claim 5 wherein said first means is an integrator for integrating the output signal from said buffer means.

8. The electrical circuit according to claim 5 wherein said second means is a latching circuit.

9. The electrical circuit according to claim 6 wherein said second means is comprised of:
- a first NAND gate having at least two inputs and one output, one of said inputs adapted to receive one of said differing input signals; and
- a second NAND gate having at least two inputs, one output, and a threshold level detection capability, one of said inputs being adapted to receive the provided output signal from said buffer means, the outputs of said first and second NAND gates cross-coupled to each others inputs, and the circuit output being taken from the output of said first NAND gate.

10. The circuit of claim 6, wherein said buffer means comprises a three-state buffer unit.

* * * * *